United States Patent
Taguchi

(10) Patent No.: US 6,211,469 B1
(45) Date of Patent: Apr. 3, 2001

(54) PRINTED CIRCUIT SUBSTRATE WITH COMB-TYPE ELECTRODES CAPABLE OF IMPROVING THE RELIABILITY OF THE ELECTRODE CONNECTIONS

(75) Inventor: Toshimichi Taguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 08/993,233

(22) Filed: Dec. 18, 1997

Related U.S. Application Data

(60) Continuation of application No. 08/448,675, filed on May 24, 1995, now abandoned, which is a division of application No. 08/247,107, filed on May 20, 1994, now Pat. No. 5,478,006.

(30) Foreign Application Priority Data

May 24, 1993 (JP) .................................... 5-121697

(51) Int. Cl.$^7$ ...................................... H05K 1/02
(52) U.S. Cl. .................. 174/260; 174/254; 349/150; 361/749
(58) Field of Search ................... 174/250–261; 361/749, 748, 807; 439/67, 77; 430/311; 349/149–152; 315/169.3, 169.4

(56) References Cited

U.S. PATENT DOCUMENTS

| | | | |
|---|---|---|---|
| 4,633,274 | 12/1986 | Matsuda | 361/776 |
| 4,985,663 | 1/1991 | Nakatani | 315/169.3 |
| 5,016,986 | 5/1991 | Kawashima et al. | 349/138 |
| 5,025,348 | 6/1991 | Suzuki et al. | 361/749 |
| 5,153,705 | 10/1992 | Fukuta et al. | 361/776 |
| 5,161,009 | 11/1992 | Tanoi et al. | 349/150 |
| 5,164,815 | 11/1992 | Lim | 257/666 |

(List continued on next page.)

FOREIGN PATENT DOCUMENTS

| | | | |
|---|---|---|---|
| 0 493 870 | 3/1991 | (EP) | 359/79 |
| 0 441 398 | 8/1991 | (EP) | 349/151 |
| 61-210648 | 9/1986 | (JP) | 437/209 |
| 63-162464 | 10/1988 | (JP) . | |
| 1-237520 | 9/1989 | (JP) | 349/152 |
| 1-251079 | 10/1989 | (JP) . | |
| 3-17628 | 1/1991 | (JP) . | |
| 3-279924 | 12/1991 | (JP) | 361/761 |

(List continued on next page.)

OTHER PUBLICATIONS

JPO Official Action of May 19, 1998 for counterpart Japanese Patent Application Serial No. 5–121697.

*Primary Examiner*—Hyung-Sub Sough
(74) *Attorney, Agent, or Firm*—Dike, Bronstein, Roberts & Cushman, LLP; David G. Conlin; George W. Neuner

(57) ABSTRACT

A printed-circuit substrate is described. A film-shaped support base having an electrical insulating property and elasticity is provided with a resin mold section for supporting an integrated circuit. A plurality of foil-shaped electric conductors are connected to the integrated circuit at their base side and are supported by the support base so as to extend toward the periphery of the support base at their tip side. The conductors are formed on a first surface of the support base and the first base faces electrodes of an external device. Exposed portions are provided by removing the support base in an intersecting direction of the foil-shaped electric conductors over an entire area of the support base between the integrated circuit and the periphery thereof, so that one portion of each foil-shaped electric conductor is exposed by separating the main support base supporting the integrated circuit and the periphery thereof. Supporting exposed portions, located on both sides of a set of the exposed portions in a direction orthogonal to the exposed portions, each have a width wider than that of each exposed portion.

4 Claims, 2 Drawing Sheets

U.S. PATENT DOCUMENTS

| | | | |
|---|---|---|---|
| 5,355,018 | 10/1994 | Fierkens | 257/669 |
| 5,448,387 | 9/1995 | Kurokawa et al. | 361/772 |
| 5,478,006 | 12/1995 | Taguchi | 228/180.21 |
| 5,606,440 | 2/1997 | Kawaguchi et al. | 349/188 |

FOREIGN PATENT DOCUMENTS

| | | | |
|---|---|---|---|
| 4-2029 | 1/1992 | (JP) . | |
| 4-29121 | 1/1992 | (JP) | 349/150 |
| 4-180693 | 6/1992 | (JP) . | |
| 4-67627 | 6/1992 | (JP) . | |
| 4-094770 | 8/1992 | (JP) . | |
| 4-90168 | 8/1992 | (JP) . | |
| 4-348049 | 12/1992 | (JP) . | |
| 5-183014 | 7/1993 | (JP) . | |
| 5-73983 | 10/1993 | (JP) . | |
| 6-43471 | 2/1994 | (JP) | 349/150 |
| 6-43475 | 2/1994 | (JP) | 349/150 |
| 6-202136 | 7/1994 | (JP) | 349/151 |

PRINTED CIRCUIT SUBSTRATE WITH COMB-TYPE ELECTRODES CAPABLE OF IMPROVING THE RELIABILITY OF THE ELECTRODE CONNECTIONS

This application is a continuation of U.S. Ser. No. 08/448,675, filed on May 24, 1995 now abandoned, which is a divisional of U.S. Ser. No. 08/247,107, filed on May 20, 1994 now U.S. Pat. No. 5,478,006.

FIELD OF THE INVENTION

The present invention relates to a printed-circuit substrate, such as a TCP (Tape Carrier Package), which includes comb-type electrodes that are connected to respective comb-type electrodes formed on a liquid-crystal panel, and an integrated circuit for driving the liquid-crystal panel (hereinafter, referred to as IC), and also relates to its connecting method.

BACKGROUND OF THE INVENTION

Recently, with regard to connecting structure between a liquid-crystal panel and an external device, printed-circuit substrates, such as TAB (Tape Automated Bonding), FPC (Flexible Printed Circuit) and TCP, have been generally employed. IC chips for driving the liquid-crystal panel are assembled on the printed-circuit substrates, thereby achieving compactness and high functionality. Thus, the packaging density of IC chips is improved in a liquid crystal display wherein these substrates are employed.

Today, in liquid crystal displays having the above-mentioned liquid-crystal panels, thin-width TCPs, which have a smaller gap between the input terminal and the output terminal, have been widely used in order to further achieve compactness.

For example, as shown in FIGS. 4 and 5, a thin-width TCP, which is formed into a belt shape, is provided with an IC chip 31 that is used for driving the liquid-crystal panel. In the thin-width TCP 30, a plurality of output electrodes 32 and input electrodes 33, which are respectively connected to the terminals of the IC chip 31, are mounted on both sides of the IC chip 31 along the length of the thin-width TCP 30.

The output electrodes 32 are formed into a comb shape in an extending manner to the left from the IC chip 31 as shown in the drawings. The input electrodes 33 are also formed into a comb shape in an extending manner to the right from the IC chip 31 as shown in the drawings. Those output electrodes 32 and the input electrodes 33 are covered with a film portion 34 and supported thereby.

In the central portion of the thin-width TCP 30 is provided an opening 34b through which the IC chip 31 is connected to the output electrodes 32 and the input electrodes 33. Ends of the output electrodes 32 and the input electrodes 33 respectively stick out inside the opening 34b.

The opening 34b is filled with protective resin through a molding process; this allows the IC chip 31 to be connected to the output electrodes 32 and the input electrodes 33, and securely fixed therein. Thus, a resin mold section 36 is formed around the IC chip 31.

Further, in the film portion 34 is formed a slit 34a by removing a part of the film portion 34 at the vicinity of the end portion on the input side. Exposed terminals 33a of the input electrodes 33 are located inside the slit 34a so as to be soldered to electrodes of a printed-circuit substrate or other substrates.

The following description will discuss a connecting method where the thin-width TCP 30 is employed. In the case where the thin-width TCP 30 is used for connecting the liquid crystal panel and the printed-circuit substrate, the output electrodes 32 and electrodes, not shown, of a liquid crystal panel 40 are first connected respectively as shown in FIG. 6 by the use of an anisotropic conductive film or other materials.

The input electrodes 33, on the other hand, are connected to the respective electrodes 42 through solder 43. Thus, the printed-circuit substrate 41 and the liquid crystal panel 40 are electrically connected to each other through the thin-width TCP 30.

The connection between the thin-width TCP 30 and the printed-circuit substrate 41 through the solder 43 is made by using a soldering iron 44. In this case, however, the resin mold section 36, which is formed through the molding process of the IC chip 31, protrudes from the back side of the thin-width TCP 30; this protruding resin mold section 36 results in a step $W_O$ even when the terminals are pressed down by the soldering iron 44.

This causes the terminals 33a to be lifted from the printed-circuit substrate 41, and since the terminals 33a do not contact the electrodes 42 well, it is difficult to solder both of them.

Therefore, in a conventional method, the terminals 33a and the electrodes 42 are soldered while avoiding the influence of the step $W_O$ caused by the protruding resin mold section 36, as shown in FIG. 6.

More specifically, the printed-circuit substrate 41 is fixed in a slanted state by using a device for supporting the printed-circuit substrate 41, not shown. This arrangement makes it possible to bring the terminals 33a in contact with the electrodes 42 while avoiding the influence of the step $W_O$ caused by the protruding resin mold section 36.

Next, after fixing the resin mold section 36 and the printed-circuit substrate 41 by the use of a temporary securing tape 45, the terminals 33a and the electrodes 42 are soldered by pressing them to contact one another using the tip of the soldering iron 44.

However, this method, which uses the thin-width TCP 30 having the conventional structure and wherein soldering is made by the soldering iron 44 while holding the conventional printed-circuit substrate 41 in the slanted state, raises the following problems.

(1) Problems Associated with the Structure of the Conventional Thin-width TCP 30:

(a) The film portion 34 in the thin-width TCP 30 has elasticity to a certain degree. Therefore, in the conventional structure wherein the terminals 33a are situated in the slit 34a, the elasticity of the film portions 34 lying on both sides of the slit 34a in the thin-width TCP 30 in the length-wise direction gives adverse effects on the pliability of the terminals 33a.

Therefore, even if the terminals 33a are pressed so as to bring them into contact with the electrodes 42, the terminals 33a tend to be lifted up, resulting in difficulty in contacting both of them.

The contact between them becomes even worse when the printed-circuit substrate 41 or the liquid crystal panel 40 has warping or when the thin-width TCP 30 has a curl-distortion in its own structure. This results in reliability problem in the connected structure between them.

(b) In particular, in the printed-circuit substrates such as thin-width TCPs 30 wherein the IC chip 31 and the slit 34a are closely located, when the thin-width TCP 30 is bent by pressing its terminals 33a using the tip of the soldering iron 44, the distortion stress may affect the resin mold section 36 and cause cracking in the resin mold section 36, if the portion of the slit 34a does not have sufficient pliability.

(2) Problems Associated With the Connecting Method:

(a) In the conventional connecting method, since the tip of the soldering iron 44 has to be brought into contact with the slanting portion, it is difficult to keep the tip stably contacting with the connecting portion. For this reason, it is hard to obtain stable solder quality and to improve the reliability of the connecting structure.

(b) The soldering iron 44 is susceptible to wear in its tip; this also makes it difficult to obtain stable solder quality and to improve the reliability of the connecting structure.

(c) The tip of the soldering iron 44 might be caught by the exposed terminals 33a, causing cutoffs in them especially when the exposed terminals 33a have narrow terminal pitches and are made of thin copper foil.

(d) As is described in (b) of (1), in the printed-circuit substrates such as thin-width TCP 30s wherein the IC chip 31 and the slit 34a are closely located, when the thin-width TCP 30 is bent by pressing its terminals 33a using the tip of the soldering iron 44, the distortion stress may affect the resin mold section 36 and cause cracking in the resin mold section 36.

SUMMARY OF THE INVENTION

The present invention is devised to solve the above-mentioned problems, and its objective is to provide a printed-circuit substrate which achieves high reliability in the connecting structure by improving the pliability of the exposed terminals for use in soldering.

Another objective of the present invention is to provide a connecting method for printed-circuit substrates by which the reliability of connecting structure is improved between the printed-circuit substrate, wherein the pliability of the exposed terminals for use in soldering is improved, and another printed-circuit substrate.

In order to achieve the above objectives, the printed-circuit substrate of the present invention is provided with: a film-shaped support base having an electrical insulating property and elasticity, which includes a resin mold section for supporting an integrated circuit; a plurality of foil-shaped electric conductors which are connected to the integrated circuit at their base side and which are supported by the support base so as to extend toward the periphery of the support base at their tip side; and exposed portions which are provided by removing the support base in the direction orthogonal to the foil-shaped electric conductors over an entire area of the support base between the integrated circuit and the periphery of the support base so as to expose one portion of each foil-shaped electric conductor.

In the above arrangement, the support base is divided into two portions, that is, one side having the integrated circuit and the other side corresponding to the periphery side, with the exposed portions located in between.

In the case of connecting the foil-shaped electric conductors to, for example, electrodes of a printed-circuit substrate, it is necessary to bring the foil-shaped electric conductors in contact with the respective electrodes through solder.

Here, the resin mold section protrudes from the undersurface of the film-shaped support base. Because of this protruding resin mold section, when the foil-shaped electric conductors on the periphery side in the support base are connected to an external device, it is difficult to keep them on the same plane as the foil-shaped electric conductors on the integrated circuit side in the support base. Therefore, it is necessary to hold the foil-shaped electric conductors on the integrated circuit side in the support base and the foil-shaped electric conductors on the periphery side in the support base at different planes.

In order to avoid the influence of the protruding resin mold section, an effective method is to bend the exposed portions so that the foil-shaped electric conductors are smoothly aligned with the respective electrodes.

In the conventional arrangement, however, in order to bend the exposed terminals, or the foil-shaped electric conductors, it was necessary to also bend the film portion, or the support base for supporting the exposed terminals. This arrangement made it difficult to keep the exposed terminals in contact with the respective electrodes due to the restoring force of the bent film portion.

Further, in the conventional arrangement, if a greater force strong enough to oppose the restoring force was applied so as to make both of them in contact, the restoring force would come to affect the resin mold section through the film portion; this tended to cause cracking in the resin mold section.

However, in the above-mentioned arrangement, since the portion of the support base is removed in the direction orthogonal to the foil-shaped electric conductors over the entire area thereof, the support base having elasticity does not exist in the adjacent areas in the direction orthogonal to the foil-shaped electric conductors.

Therefore, in the case of bringing the foil-shaped electric conductors into contact with the electrodes and soldering both of them, it is possible to prevent the foil-shaped electric conductors from being lifted up and separated from the electrodes due to the restoring force of the support base, which is different from the conventional arrangement.

As described above, by improving the pliability of the exposed portions, the above-mentioned arrangement achieves high adhesion between the foil-shaped electric conductors and the electrodes. As a result, when electrical connection is made between the foil-shaped electric conductors and the electrodes by means of soldering, the reliability of the connecting structure is improved.

Moreover, different from the conventional arrangement, the above-mentioned arrangement makes it possible to prevent the stress that is imposed on the resin mold section due to the restoring force from the bent film portion; this reduces cracking that might occur in the resin mold section. Thus, when applied to connections between printed-circuit substrates such as used in liquid crystal displays, etc., the above-mentioned arrangement reduces the possibility of defective products in manufacturing liquid crystal displays or other apparatuses.

In order to achieve another objective of the present invention, the connecting method for printed-circuit substrates of the present invention, which uses a printed-circuit substrate having first and second support bases, a resin mold section for fixing an integrated circuit supported by the first support base, and a plurality of foil-shaped electric conductors that are installed on the first and second support bases and connected to the integrated circuit respectively so as to connect the first and second support bases in a separated manner with each other, is provided with the step of soldering the foil-shaped electric conductors on the second support base by pressing and heating the second support base.

In this method, by bending the foil-shaped electric conductors exposed between the first and second support bases, the second support base is shifted with respect to the first support base during the pressing and heating process so that both of the bases are situated at the different planes.

In this case, neither the first support base nor the second support base is located along an area corresponding to a line connecting the bent points of the foil-shaped electric conductors and its extended line. Therefore, even if the foil-shaped electric conductors are bent, the first and second support bases are not bent.

Moreover, in the case where the foil-shaped electric conductors of the first and second support bases are respectively connected to external devices, the resin mold section, which protrudes from the surface of the first support base, makes it difficult for the foil-shaped electric conductors of the first and second support bases to be aligned on the same plane so as to be connected. Therefore, it is necessary to hold the foil-shaped electric conductors of the first and second support bases at different planes.

Here, in the case where the foil-shaped electric conductors of the second support base are connected, for example, to electrodes on a printed-circuit substrate by means of soldering, the above-mentioned method prevents the restoring force that is caused by the bent film portion, which is a conventional form of the support base. This eliminates the necessity of having to take into consideration the restoring force that is-exerted on the foil-shaped electric conductors and the electrodes in their separating directions.

With this method, when the foil-shaped electric conductors of the second support base are soldered, for example, to electrodes of a printed-circuit substrate by applying pressure and heat, the soldering process is carried out with both of them securely made contact with each other, thereby improving the reliability of the connection between them.

Furthermore, in the above-mentioned method, it is not necessary to heat up the exposed foil-shaped electric conductors for soldering; this eliminates the necessity of having to take into consideration the length of the foil-shaped electric conductors with regard to the soldering. Therefore, it is not necessary to provide long length for the exposed portions of the foil-shaped electric conductors, thereby making it possible to miniaturize the entire structure consisting of the first and second support bases.

Therefore, the pliability of the exposed portions of the foil-shaped electric conductors is improved so that two bent positions are provided in each of those portions. Thus, the second support base, which becomes movable by pressure and heat, is maintained horizontally without the necessity of having to maintain it in a slanted state to the first support base as is conventionally done. This makes it possible to stabilize the state of the second support base when it is pressed during the pressing and heating process, thereby allowing a stable soldering process.

Further, since the exposed portions are not pressed and heated, it is possible to prevent cutoffs caused when the tip of the soldering iron is caught on the exposed portion during the pressing and heating process. As described above, the above-mentioned method further improves the reliability of the connection between the foil-shaped electric conductors of the second support base and, for example, electrodes of a printed-circuit substrate.

In addition to the above method, a pressing and heating means for pressing and heating the second support base may be provided, and a film material for preventing contaminants from adhering to the pressing and heating means may be sandwiched between the pressing and heating means and the second support base.

In this method, it is possible to prevent contaminants such as solder fragments or flux from adhering to the tip of the pressing and heating means. Therefore, it is not necessary to clean the tip by using a grindstone, sandpaper or a brush, thereby preventing the tip from wearing out. As a result, the shape of the pressing and heating means is well maintained, and stable pressing and heating conditions are obtained. The use of this connecting method further improves the reliability of the connection, as well as extending the life of the pressing and heating means.

For a fuller understanding of the nature and advantages of the invention, reference should be made to the ensuing detailed description taken in conjunction with the accompanying drawings.

DESCRIPTION OF THE EMBODIMENTS

Figure 1:
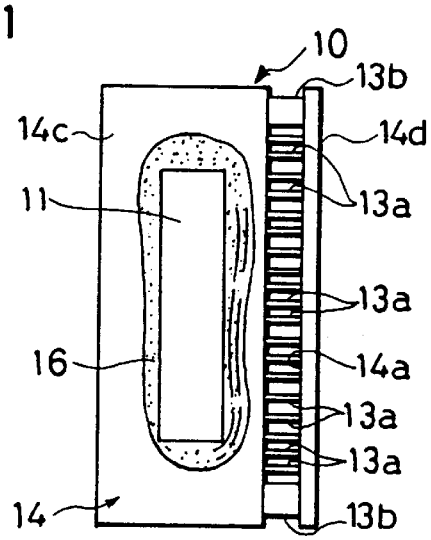
FIG. 1 is a plan view showing a thin-width TCP that is used as a printed-circuit substrate of the present invention.
Figure 2:
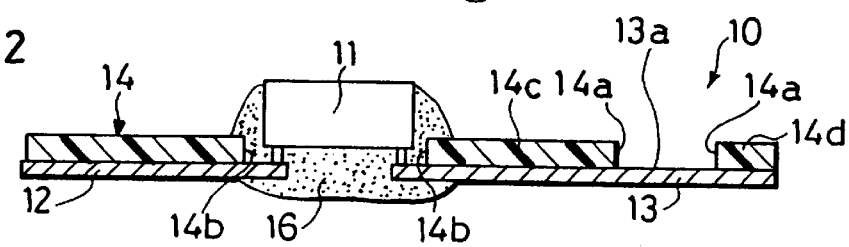
FIG. 2 is a cross-sectional view of the thin-width TCP.
Figure 3:
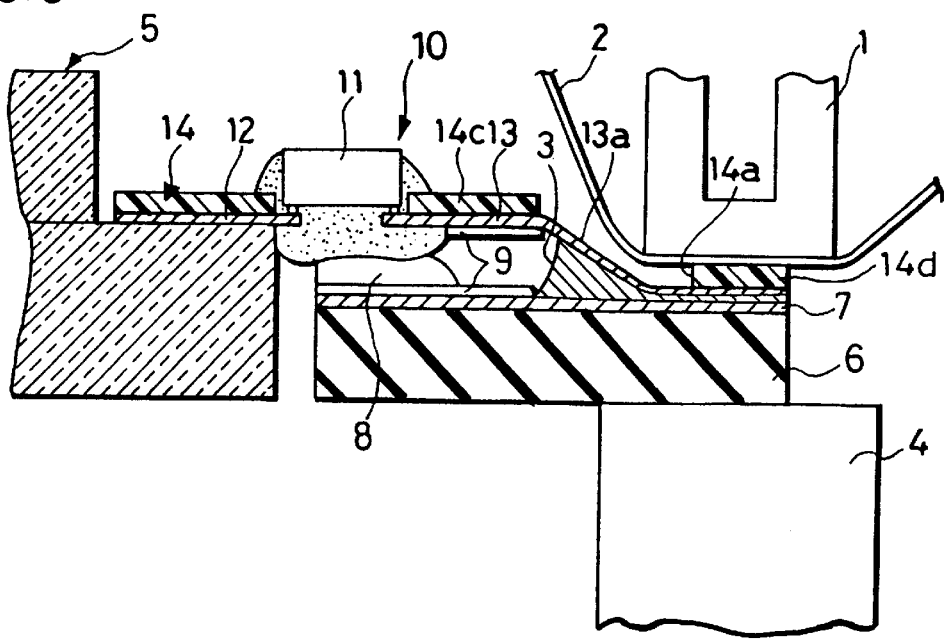
FIG. 3, which is an explanatory drawing that shows the thin-width TCP of FIG. 2 for connecting a liquid crystal panel and a printed-circuit substrate, also illustrates a state in which the input electrodes of the thin-width TCP and the electrodes of the printed-circuit substrate are soldered and a connecting device used in the soldering process.
Figure 4:
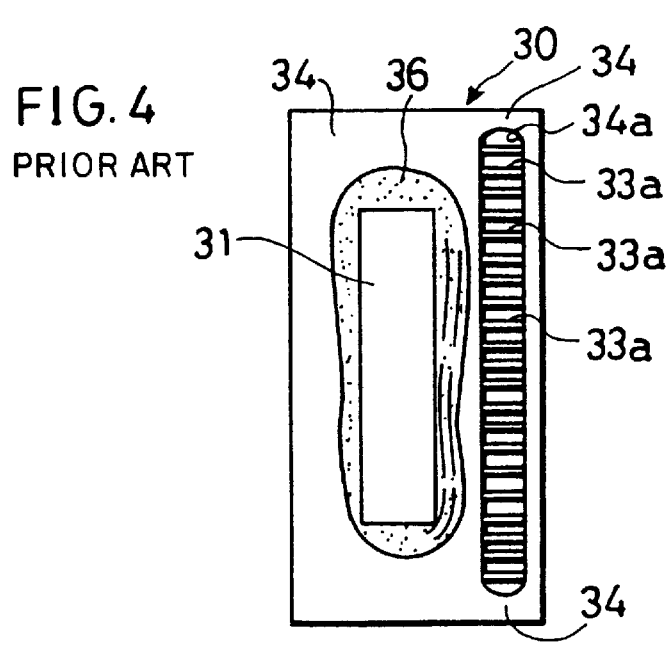
FIG. 4 is a plan view of a conventional thin-width TCP.
Figure 5:
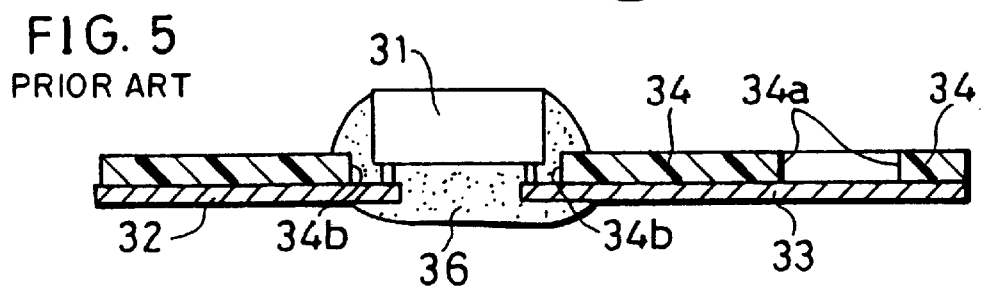
FIG. 5 is a cross-sectional view of the thin-width TCP.
Figure 6:
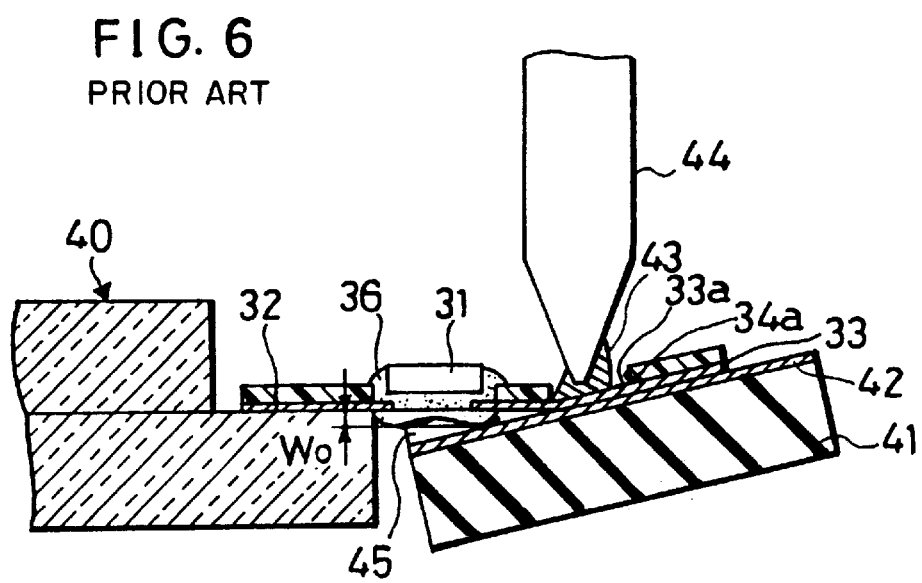
FIG. 6 is an explanatory drawing that shows a state wherein the input electrodes of the thin-width TCP of FIG. 5, to which a liquid crystal panel is connected, and electrodes of a printed-circuit substrate are soldered.

Referring to FIGS. 1 through 3, the following description will discuss one embodiment of the present invention.

As illustrated in FIGS. 1 and 2, a printed-circuit substrate of the present embodiment is provided with a thin-width TCP 10 which is formed into a thin rectangular shape. Hereinafter, longer sides of the thin-width TCP 10 are referred to as sides and shorter sides thereof are referred to as ends. The thin-width TCP 10 is used for connecting, for example, a liquid crystal panel and a printed-circuit substrate for releasing signals to drive the panel, and is provided with an IC chip 11 for driving the liquid crystal panel.

The IC chip 11, which has a virtually rectangular parallelopiped shape, is fixed in the center of the thin-width TCP 10 so that the length-wise direction of the IC chip 11 coincides with the length-wise direction of the thin-width TCP 10.

The TCP 10 is provided with a plurality of output electrodes 12 and a plurality of input electrodes 13 that are respectively connected to the terminals of the IC chip 11. Those output electrodes 12 and input electrodes 13 are made of foil-shaped electric conductors, and are formed into a belt-like shape. The materials of the foil-shape electric conductors are gold, silver, aluminum, copper, and their alloys, as well as light-transmitting electric conductors such as indium tin oxide.

The output electrodes 12 are respectively disposed from the terminals of the IC chip 11 to one side of the thin-width TCP 10, that is, in an extending manner to the left in the drawing.

The input electrodes 13, on the other hand, are respectively disposed from the terminals of the IC chip 11 to the other side of the thin-width TCP 10, that is, in an extending manner to the right in the drawing.

Those output and input electrodes 12 and 13 are covered with a film portion 14 made of a resin film from above, and supported by the film portion 14. In this manner, the output and input electrodes 12 and 13 are formed under the film portion 14, and located along the film portion 14 in the length-wise direction.

The output and input electrodes 12 and 13 are aligned virtually in parallel with one another in the proximity of the sides of the film portion 14, and arranged in the length-wise direction of the film portion 14 with virtually the same interval between them. In other words, the output and input electrodes 12 and 13 are respectively arranged into a comb shape in the proximity of the sides of the film portion 14.

The film portion 14 has flexibility which allows it to be freely bent, elasticity, and heat resistance. The resistance to heat of the film portion 14 is provided in such a degree that its property is not altered even after having been subjected to heat applied by solder 3 so as to connect the input electrodes 13 for a predetermined period of time, for example, for two or three minutes (see FIG. 3).

An opening 14b for holding the IC chip 11 therein is formed in the center of the film portion 14. The end portions of the output and input electrodes 12 and 13 stick out and are exposed inside the opening 14b.

The opening 14b is filled with protective resin such as epoxy resin through a molding process; this allows the IC chip 11 to be securely fixed and connected to the base portions of the output and input electrodes 12 and 13. Thus, a resin mold section 16 is formed around the IC chip 11.

Further, in the film portion 14, is provided a removed section 14a that runs from end to end in the direction orthogonal to the input electrodes 13, that is, over an entire area along the length of the film portion 14.

In the removed section 14a, are located exposed terminals 13a which are the exposed forms of the input electrodes 13. The exposed terminals 13a are used when the input electrodes 13 are soldered to electrodes 7 of a printed-circuit substrate 6, which will be described later (see FIG. 3).

In this manner, the film portion 14 is constituted of a main film portion 14c having the IC chip 11 and a belt-like peripheral film portion 14d that is separated from the main film portion 14c and connected thereto through the exposed terminals 13a.

The peripheral film portion 14d is disposed virtually in parallel with the main film portion 14c in the length-wise direction of the film portion 14. The peripheral film portion 14d thus maintains the exposed terminals 13a with the same interval between them by holding the tips of the input electrodes 13, thereby preventing contact between the exposed terminals 13a.

Moreover, inside the removed section 14a, are provided a pair of supporting terminals 13b for reducing a mechanical load that is to be imposed on the exposed terminals 13a connecting the main film portion 14c and the peripheral film portion 14d.

The supporting terminals 13b, each of which is a foil-shaped electric conductor made of a material such as copper foil and has a width wider than that of the exposed terminals 13a, are respectively installed on both ends of the exposed terminals 13a in parallel with them.

The supporting terminals 13b support the peripheral film portion 14d; this makes it possible to reduce the mechanical load imposed on the exposed terminals 13a that support the peripheral film portion 14d, thereby preventing cutoffs in the exposed terminals 13a due to the mechanical load.

Next, the following description will discuss a connecting method wherein a liquid crystal panel 5, provided as a liquid crystal display device, and a printed-circuit substrate 6 for driving the liquid crystal panel 5 are connected to each other by using the above-mentioned thin-width TCP 10.

As shown in FIG. 3, the printed-circuit substrate 6 is provided with a plurality of electrodes 7 in positions corresponding to those input electrodes 13 installed in the thin-width TCP 10. The liquid crystal panel 5, on the other hand, is provided with a plurality of liquid-crystal-panel electrodes, not shown, in positions corresponding to those output electrodes 12 installed in the thin-width TCP 10.

Here, in the case of connecting the thin-width TCP 10, the printed-circuit substrate 6, and the liquid crystal panel 5 to one another so as to construct, for example, a liquid crystal display, since the resin mold section 16 has a protruding form, it is necessary to shift the peripheral film portion 14d with respect to the main film portion 14c to be located on a different plane.

First, the liquid-crystal-panel electrodes of the liquid crystal panel 5 and the output electrodes 12 of the thin-width TCP 10 are electrically connected respectively through an anisotropic conductive film.

These connections are made as follows: an anisotropic conductive film having a predetermined thickness, not shown, is formed on the liquid-crystal-panel electrodes of the liquid crystal panel 5; the output-side of the thin-width TCP 10 are positioned and superimposed onto the anisotropic conductive film so that the output electrodes 12 are aligned face to face with the corresponding liquid-crystal-panel electrodes; and contact bonding with heat is made by pressing a heating tool or the like from the thin-width TCP 10 side.

Next, the input electrodes 13 in the thin-width TCP 10 are electrically connected to the respective electrodes 7 of the printed-circuit substrate 6 through solder 3 by using a connecting device such as a pulse heat bonder.

Here, an explanation will be given on the connecting device that is used for soldering the input electrodes 13 and the electrodes 7. As illustrated in the drawing, the connecting device is provided with a substrate supporting plate 4 whereon the printed-circuit substrate 6 is placed, a heating tool 1 located above the substrate supporting plate 4 which is provided as the pressing and heating means, and a cleaning film (film material) 2 that is placed between the tip face of the heating tool 1 and the substrate supporting plate 4.

The heating tool 1, which is driven to move up and down on demand, is of a pulse heating type wherein a pulse current is flown instantaneously only upon pressing process as to apply heat instantaneously.

The cleaning film 2 is made of an extremely thin organic film such as a polyamide resin film, especially aromatic polyamide resin film, and has the property of heat resistance with a low coefficient of linear expansion. The cleaning film 2, which has a long tape shape, is sent from one side to the other by a predetermined length every time it is used, and is then reeled up. In this manner, the cleaning film 2 is used while contacting a heating face provided on the tip of the heating tool 1.

When soldering is made to connect the input electrodes 13 and the electrodes 7 by using the above-mentioned connecting device, the printed-circuit substrate 6 is first placed on the substrate supporting plate 4, and solder 3 is put on the electrodes 7 of the printed-circuit substrate 6, as well as applying flux thereto in order to improve its connecting property.

Here, prior to putting the solder 3 thereon, resist 9 is respectively applied to predetermined areas on the electrodes 7 of the printed-circuit substrate 6 and the input electrodes 13 of the thin-width TCP 10, that is, to areas from the terminals 13a to the IC chip 11 in order to prevent adhesion of the solder 3.

Then, positioning is made so that the input electrodes 13 of the thin-width TCP 10 and the corresponding electrodes 7 are aligned face to face with one another, and the thin-width TCP 10 and the printed-circuit substrate 6 are laminated with the solder 3 sandwiched in between, and then both of them are temporarily fixed by the use of a temporary fixing tape 8 that is preliminarily affixed onto the printed-circuit substrate 6.

Next, the heating tool 1 is pressed on the peripheral film portion 14d with the cleaning film 2 sandwiched in between so that the solder 3 is heated up instantaneously and melted down, and then the solder 3 cools off.

In this manner, the electrodes 7 and the input electrodes 13 are electrically connected. After the solder 3 has cooled off below its melting point, the heating tool 1 is raised, and the cleaning film 2 is reeled up by the predetermined length in the predetermined direction. Thus, the cleaning film 2 to contact the tip face of the heating tool 1 is updated.

When heated, some of the solder 3, as shown in FIG. 3, advantageously wicks out to be sandwiched between the bent portions 13a. Because there is no spring-back resilience of the electrodes 13 due to the lack of film 14 thereon, this solder advantageously provides stability to the connectors at a portion of their bent portions 13a.

As described above, in the thin-width TCP 10 of the present embodiment, the removed section 14a, which is formed for exposing the exposed terminals 13a, is provided in such a manner that it runs from end to end in the direction orthogonal to the input electrodes 13, that is, over an entire belt-like area along the length of the film portion 14. Therefore, no film portion 14 exists on either area adjacent to the set of the exposed terminals 13a in the length-wise direction of the thin-width TCP 10.

Therefore, even if the exposed terminals 13a made of copper foil or other materials are bent, it is possible to prevent the restoring force that is caused by the elasticity of the film portion 14, which is different from the conventional arrangement. This allows the exposed terminals 13a to be plastically deformed with ease. As a result, the pliability of the thin-width TCP 10 is improved in its area where the exposed terminals 13a are located, in comparison with the conventional arrangement.

With this arrangement, when soldering is made between the tips of the input electrodes 13 of the thin-width TCP 10 and the electrodes 7, the input electrodes 13 located on the undersurface of the peripheral film portion 14d and the electrodes 7 on the printed-circuit substrate 6 are easily brought into contact with each other with the solder 3 sandwiched in between by bending the exposed terminals 13a.

In the thin-width TCP 10, the IC chip 11 is supported inside the opening 14b by the resin mold section 16. Further, in order that the thin-width TCP 10 holds the resin mold section 16 firmly, the resin mold section 16 is formed in such a manner as to sandwich the surrounding portion of the opening 14b from above and from under. This arrangement causes the resin mold section 16 to protrude from the surface and undersurface of the thin-width TCP 10.

In the case of connecting the input electrodes 13 of the thin-width TCP 10 to the electrodes 7 by means of soldering, the printed-circuit substrate 6 is brought close to the liquid crystal panel 5 to be-positioned under the resin mold section 16 so as to achieve compactness; therefore, the printed-circuit substrate 6 is located face to face with the resin mold section 16.

However, in conventional methods, when the exposed terminals of a TCP having such a resin mold section are connected to the electrodes of a printed-circuit substrate, the exposed terminals of the TCP are bent so that the exposed terminals are brought in close contact with the electrodes in order to achieve compactness as described above as well as avoiding the influence of the protruding structure of the resin mold section.

When the exposed terminals are bent, it is also necessary to bend the film portion that supports the exposed terminals. For this reason, it is difficult to make the exposed terminals and the electrodes in contact with each other due to the restoring force of the bent film portion.

Moreover, if a greater force is applied against the restoring force in order to make them in contact, the restoring force imposed on the resin mold section increases; this might cause cracking in the resin mold section.

However, in the arrangement of the present embodiment, no film portions 14a exist on either side of the set of the exposed terminals 13a in the direction orthogonal to the exposed terminals 13a. For this reason, even if the exposed terminals 13a are bent, there is no film portion 14a to be bent.

Therefore, in the case of bringing the tips of the input electrodes 13 into contact with the electrodes 7 and soldering both of them, it is possible to prevent the input electrodes 13 from being lifted up and separated from the electrodes 7 due to the restoring force of the film portion provided as the support base, which is different from the conventional arrangement.

Further, the pliability of the exposed terminals 13a is improved so that two bent positions are provided in them; this makes it possible to maintain the peripheral film portion 14d horizontally even when it is shifted with respect to the main film portion 14c. This arrangement eliminates the necessity of having to maintain the printed-circuit substrate in a slanted state as is conventionally done. This arrangement also makes it possible to stabilize the state of the peripheral film portion 14d when it is pressed and heated, thereby improving the contact between the input electrodes 13 and the electrodes 7.

Thus, soldering is securely made between the input electrodes 13 and the electrodes 7 by applying heat and pressure to the peripheral film portion 14d that supports the input electrodes 13 by the use of the heating tool 1.

Consequently, the arrangement and method of the present embodiment, wherein the liquid crystal panel 5 and the printed-circuit substrate 6 are brought in close contact with each other so as to be electrically connected, make it possible to achieve compactness, as well as improving the reliability of the connection between the input electrodes 13 and the electrodes 7.

At the same time, since the exposed terminals 13a has high pliability and since no restoring force is applied by the elasticity of the film portion 14, different from the conventional arrangements, neither distortion stress nor restoring force is transmitted to the main film portion 14c when the exposed terminals 13a are bent. Therefore, the restoring force or other forces is not imposed on the resin mold section 16 that supports the IC chip 11 on the main film portion 14c, thereby eliminating cracking that might occur in the resin mold section 16.

Moreover, in the present embodiment, soldering is made between the input electrodes 13 of the thin-width TCP 10 and the electrodes 7 of the printed-circuit substrate 6 by applying heat and pressure to the peripheral film portion 14d by the use of the heating tool 1; therefore, this arrangement eliminates the necessity of having to heat the exposed terminals 13a by pressing the heating tool 1 directly onto the exposed terminals 13a inside the removed section 14a. This makes it possible to prevent cutoffs that tend to occur when the exposed terminals 13a are pressed.

As described above, the arrangement and method of the present embodiment improve the reliability of the connecting structure in the liquid crystal display wherein, for example, the thin-width TCP 10 is employed, thereby contributing to high yield of the liquid crystal display.

Furthermore, as to the heating tool 1, a no-cut tool with a wide width, which is easily produced by a machining process at low cost and has stable heating characteristics, may be employed.

Different from the conventional method wherein the heating tool 1 is brought inside the removed section 14a during the connecting operation, it is not necessary for the above-mentioned method to machine the heating tool 1 so as to impart a thin width; therefore, an effective connecting operation is available without being influenced by the shape and the machining limitations of the tool.

At the same time, the method of the present embodiment eliminates the necessity of having to bring the heating tool 1 into the removed section 14a with high positioning precision, thereby simplifying the construction of the connecting device.

In the conventional methods, the heating tool 1 has to be prepared by cut-out machining it so as to be exclusively adapted to each kind and the number of the thin-width TCPs 10 as well as to the array pitch of each thin-width TCP 10, and when the heating tool 1 is exchanged, it is necessary to take into consideration the balance of the heating tool 1. However, the method of the present embodiment eliminates these necessities, thereby cutting cost required for the connecting process as well as improving the efficiency of work.

Further, in the connecting device of the present invention, the cleaning film 2 for covering the tip of the heating tool 1 is provided; this arrangement prevents contaminants such as fragments of solder 3 or flux from adhering to the tip of the heating tool 1.

Therefore, it is not necessary to clean the tip of the heating tool 1 by using a grindstone, sandpaper or a brush, thereby preventing the tip from wearing out during the cleaning process. As a result, the shape of the tip of the heating tool 1 is well maintained, thereby providing stable pressing and heating conditions. The use of the heating tool 1 for the connecting process further improves the reliability of the connection, as well as extending the life of the heating tool 1.

The above-mentioned arrangement prevents the adhesion of solder onto the tip of the heating tool 1; therefore, in the case of forming the heating tool 1 into a long-length one-bar shape, it is not necessary to employ titanium as the material of the heating tool 1. Instead of titanium which has an anti-adhering property to solder although its temperature distribution is unstable, superinvar having stable heating characteristics may be adopted.

As a result, it becomes possible to solder many of those thin-width TCPs 10 in a batch process by the use of the heating tool 1 having the long-length one-bar shape, thereby improving the productivity to a great degree.

Moreover, since it is not necessary to shape the heating tool 1 to have a multi-blade structure such as a short, divided titanium tool, no exchange in types of the tool is required for any kinds and the number of the thin-width TCPs 10 as well as for any array pitch of the thin-width TCP 10.

Here, in the case of the heating tools having the multi-blade structure such as a divided titanium tool, since it is very difficult to keep balances of pressure among the heating tools, exchange is required for each shank of the tool mounting base; this raises many problems such as low efficiency of work, high cost, and expensive managing cost.

Additionally, in the present embodiment, the method is adopted, wherein soldering is made by pressing and heating the peripheral film portion 14d by the use of the heating tool 1; yet, the conventional method, wherein soldering is made by using a soldering iron while holding the printed-circuit substrate 6 in a slanted state, may be adopted.

Even in the case of adopting the conventional connecting method, the arrangement of the present embodiment prevents the exposed terminals 13a from being lifted up from the electrodes 7, thereby improving the contact between them, as well as reducing cracking that might occur in the resin mold section 16.

Moreover, in the present embodiment, the heating tool 1 of a pulse-heating type is employed as the heating means; therefore, instantaneous heating and cooling processes are available. In comparison with a heating method using heat-resistant glass through which light-related heating such as provided by infrared rays is applied, since the temperature of the heating tool is directly detected and controlled, this arrangement makes it possible to provide easier job control, obtain soldering of high quality, improve the reliability of the connection by soldering, and improve the efficiency of work.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A printed-circuit substrate comprising:

a film-shaped support base having an electrical insulating property and elasticity, the film-shaped support base being provided with a resin mold section for supporting an integrated circuit;

an integrated circuit supported by said resin mold section;

a plurality of foil-shaped electric conductors which are connected to the integrated circuit at their base side and which are supported by the support base so as to extend toward the periphery of the support base at their tip side, the conductors being formed on a first surface of the support base, the first surface facing electrodes of an external device;

exposed portions, which are provided by removing the support base in an intersecting direction of the foil-shaped electric conductors over an entire area of the support base between the integrated circuit and the periphery thereof, so that one portion of each foil-shaped electric conductor is exposed by separating the film-shaped support base supporting the integrated circuit and the periphery thereof; and supporting exposed electric conductor portions, located on both sides of a set of the exposed portions in a direction orthogonal to the exposed portions, each supporting exposed portion having a width wider than that of each exposed portion.

2. The printed-circuit substrate as defined in claim 1, wherein the support base has sufficient heat resistance to withstand high temperatures encountered while soldering the foil-shaped electric conductors.

3. The printed-circuit substrate as defined in claim 1, wherein the support base is formed into a thin-width rectangular shape and the foil-shaped electric conductors are shaped so as to extend toward the longer sides of the support base.

4. The printed-circuit substrate as defined in claim 1, wherein the support base has an opening wherein base ends of the foil-shaped electric conductors are exposed and the integrated circuit connected to the base ends of the foil-shaped electric conductors is supported by the resin mold section.

* * * * *